(12) United States Patent
Borini et al.

(10) Patent No.: US 10,381,503 B2
(45) Date of Patent: Aug. 13, 2019

(54) APPARATUS AND METHOD FOR CONTROLLING DOPING (71) Applicant: EMBERION OY, Espoo (FI)

(72) Inventors: Stefano Borini, Cambridge (GB); Alan Colli, Cambridge (GB)

(73) Assignee: EMBERION OY, Espoo (FI)

(*) Notice: Subject to any disclaimer, the term of this patent is extended or adjusted under 35 U.S.C. 154(b) by 0 days.

(21) Appl. No.: 15/523,476

(22) PCT Filed: Oct. 26, 2015

(86) PCT No.: PCT/FI2015/050732
§ 371 (c)(1),
(2) Date: May 1, 2017

(87) PCT Pub. No.: WO2016/066897
PCT Pub. Date: May 6, 2016

(65) Prior Publication Data
US 2017/0316941 A1 Nov. 2, 2017

(30) Foreign Application Priority Data

Oct. 31, 2014 (EP) .................................... 14191383
Mar. 30, 2015 (EP) .................................... 15161553

(51) Int. Cl.
*G01J 5/04* (2006.01)
*G01J 5/10* (2006.01)
(Continued)

(52) U.S. Cl.
CPC ............ *H01L 31/113* (2013.01); *G01J 5/046* (2013.01); *G01J 5/10* (2013.01); *G01J 5/34* (2013.01);
(Continued)

(58) Field of Classification Search
None
See application file for complete search history.

(56) References Cited

U.S. PATENT DOCUMENTS 4,110,616 A 8/1978 Porter et al.
4,608,865 A 9/1986 Muller et al.
(Continued)

FOREIGN PATENT DOCUMENTS

DE 41 05 591 C1 4/1992
GB 2 021 761 A 12/1979
(Continued)

OTHER PUBLICATIONS

International Search Report & Written Opinion dated Feb. 17, 2016 corresponding to International Patent Application No. PCT/FI2015/050732.
(Continued)

*Primary Examiner* — Telly D Green
(74) *Attorney, Agent, or Firm* — Squire Patton Boggs (US) LLP (57) ABSTRACT An apparatus and method, the apparatus comprising: at least one charged substrate (3); a channel of two dimensional material (5); and at least one floating electrode (7A-C) wherein the floating electrode comprises a first area (10A-C) adjacent the at least one charged substrate, a second area (11A-C) adjacent the channel of two dimensional material and a conductive interconnection (9A-C) between the first area and the second area wherein the first area is larger than the second area and wherein the at least one floating electrode is arranged to control the level of doping within the channel of two dimensional material.

10 Claims, 5 Drawing Sheets (51) Int. Cl.
*G01J 5/34* (2006.01)
*H01L 21/04* (2006.01)
*H01L 29/16* (2006.01)
*H01L 29/40* (2006.01)
*H01L 29/423* (2006.01)
*H01L 29/778* (2006.01)
*H01L 29/786* (2006.01)
*H01L 31/113* (2006.01)
*H01L 31/119* (2006.01)
*H01L 31/0352* (2006.01)

(52) U.S. Cl.
CPC ........ *H01L 21/041* (2013.01); *H01L 29/1606* (2013.01); *H01L 29/4238* (2013.01); *H01L 29/42384* (2013.01); *H01L 29/778* (2013.01); *H01L 29/78603* (2013.01); *H01L 29/78645* (2013.01); *H01L 29/78684* (2013.01); *H01L 29/78696* (2013.01); *H01L 31/035218* (2013.01); *H01L 31/119* (2013.01); *H01L 29/404* (2013.01)

(56) References Cited

U.S. PATENT DOCUMENTS

| | | | | |
|---|---|---|---|---|
| 7,652,317 | B2* | 1/2010 | Watanabe | H01L 27/115 257/315 |
| 7,821,054 | B2* | 10/2010 | Watanabe | H01L 27/11521 257/315 |
| 2004/0201058 | A1* | 10/2004 | Sonoda | H01L 27/115 257/314 |
| 2007/0158699 | A1* | 7/2007 | Watanabe | H01L 27/115 257/264 |
| 2009/0015491 | A1 | 1/2009 | Ikeda et al. | |
| 2009/0321807 | A1* | 12/2009 | Watanabe | H01L 27/115 257/315 |
| 2011/0147723 | A1 | 6/2011 | Hodges, Jr. et al. | |
| 2015/0338390 | A1* | 11/2015 | Anglin, Jr. | G01N 33/497 73/23.3 |
| 2016/0284811 | A1* | 9/2016 | Yu | H01L 29/454 |
| 2017/0162704 | A1 | 6/2017 | Abe et al. | |

FOREIGN PATENT DOCUMENTS

| | | |
|---|---|---|
| JP | 2599354 B2 | 4/1997 |
| JP | 3018174 B1 | 3/2000 |

OTHER PUBLICATIONS

European Search Report dated Oct. 7, 2015 corresponding to European Patent Application No. 15161553.1.
Cher Xuan Zhang et al., "Electrical Stress and Total Ionizing Dose Effects on Graphene-Based Non-Volatile Memory Devices," IEEE Transactions on Nuclear Science, vol. 59, No. 6, Dec. 2012, pp. 2974-2978, XP011487520.
Alessandro Tredicucci et al., "Device Concepts for Graphene-Based Terahertz Photonics," IEEE Journal of Selected Topics in Quantum Electronics, IEEE, vol. 20, No. 1, Jan. 1, 2014, p. 8500109, XP011526240.
Zhenhua Sun et al.: "Infrared Photodetectors Based on CVD-Grown Graphene and PbS Quantum Dots with Ultrahigh Responsivity," Advanced Materials, vol. 24, No. 43, Nov. 14, 2012, pp. 5878-5883, XP55243035.
International Search Report & Written Opinion dated Jan. 29, 2016 corresponding to International Patent Application No. PCT/FI2015/050709.
International Search Report & Written Opinion dated Jan. 29, 2016 corresponding to International Patent Application No. PCT/FI2015/050719.
European Search Report dated Mar. 1, 2016 corresponding to European Patent Application No. 15173329.2.
Honghuu Sun et al., "A Low Contact Resistance Graphene Field Effect Transistor with Single-Layer-Channel and Multi-Layer-Contact", 2014 IEEE/ACM International Symposium on Nanoscale Architectures, pp. 139-144.
U.S. Office Action issued in corresponding U.S. Appl. No. 15/523,104 dated Aug. 29, 2018.

* cited by examiner

APPARATUS AND METHOD FOR CONTROLLING DOPING

TECHNOLOGICAL FIELD

Examples of the disclosure relate to an apparatus and method for controlling doping. In particular, examples of the disclosure relate to an apparatus and method for controlling doping in two dimensional materials such as graphene.

BACKGROUND

Two dimensional materials such as graphene may be used in electronic devices. It is useful to be able to control the doping profiles of such materials.

BRIEF SUMMARY

According to various, but not necessarily all, examples of the disclosure, there may be provided an apparatus comprising: at least one charged substrate; a channel of two dimensional material; and at least one floating electrode wherein the floating electrode comprises a first area adjacent the at least one charged substrate, a second area adjacent the channel of two dimensional material and a conductive interconnection between the first area and the second area wherein the first area is larger than the second area and wherein the at least one floating electrode is arranged to control the level of doping within the channel of two dimensional material.

In some examples the apparatus may comprise a plurality of floating electrodes. In some examples different floating electrodes may have different first areas. In some examples different floating electrodes have different second areas. In some examples the different floating electrodes are provided adjacent to different portions of the channel of two dimensional material to enable different levels of doping to be provided in different portions of the channel of two dimensional material.

In some examples the doping within the two dimensional material may be dependent upon an electric field provided by the second area of the floating electrode.

In some examples, for each floating electrode, a charged substrate and the first area of the floating electrode may form a first capacitor having a first electric field dependent upon the charge on the substrate and wherein the first electric field causes, at the second area of the floating electrode, a second electric field that is dependent upon the first electric field amplified by a ratio of the first area to the second area.

In some examples at least one floating electrode may be provided on a first side of a charged substrate and at least one floating electrode may be provided on a second side of the charged substrate.

In some examples an insulating material may be provided between the channel of two dimensional material and the second area of the floating electrode.

In some examples the channel of two dimensional material may be provided on a charged substrate. The first area of the floating electrodes may overlie a first area of the charged substrate wherein the channel of the two dimensional material does not extend over the first area. An insulating material may be provided between the charged substrate and the channel of two dimensional material.

In some examples the channel of two dimensional material may comprise graphene.

In some examples the at least one charged substrate may comprise at least one of; a ferroelectric material, a piezoelectric material, a pyroelectric material or any other suitable material.

In some examples the apparatus may further comprise a controller configured to control the charge on the at least one charged substrate.

According to various, but not necessarily all, examples of the disclosure, there may be provided a method comprising: providing at least one charged substrate; providing a channel of two dimensional material; and controlling the level of doping within the channel of two dimensional material by providing at least one floating electrode wherein each floating electrode comprises a first area adjacent to the at least one charged substrate, a second area adjacent the channel of two dimensional material and a conductive interconnection between the first area and the second area wherein the first area is larger than the second area.

In some examples the method may further comprise providing a plurality of floating electrodes. In some examples different floating electrodes may have different first areas. In some examples different floating electrodes may have different second areas. The different floating electrodes may be provided adjacent to different portions of the channel of two dimensional material to enable different levels of doping to be provided in different portions of the channel of two dimensional material.

In some examples the doping within the two dimensional material may be dependent upon an electric field provided by the second area of the floating electrode.

In some examples for each floating electrode a charged substrate and the first area of the floating electrode may form a first capacitor having a first electric field dependent upon the charge on the substrate and wherein the first electric field causes, at the second area of the floating electrode, a second electric field that is dependent upon the first electric field amplified by a ratio of the first area to the second area.

In some examples the method may further comprise providing at least one floating electrode on a first side of a charged substrate and providing at least one floating electrode on a second side of the charged substrate.

In some examples the method may further comprise providing an insulating material between the channel of two dimensional material and the second area of the floating electrode.

In some examples the method may further comprise providing the channel of two dimensional material on a charged substrate. The first area of the floating electrodes may overlie a first area of the charged substrate wherein the channel of the two dimensional material does not extend over the first area. The method may also comprise providing an insulating material is provided between the charged substrate and the channel of two dimensional material.

In some examples the channel of two dimensional material may comprise graphene.

In some examples the at least one charged substrate may comprise at least one of; a ferroelectric material, a piezoelectric material, a pyroelectric material or any other suitable material.

In some examples the method may further comprise controlling the charge on the at least one charged substrate.

According to various, but not necessarily all, examples of the disclosure there may be provided examples as claimed in the appended claims.

BRIEF DESCRIPTION

For a better understanding of various examples that are useful for understanding the detailed description, reference will now be made by way of example only to the accompanying drawings in which.

DETAILED DESCRIPTION

The Figures illustrate an apparatus 1 comprising: at least one charged substrate 3; a channel of two dimensional material 5; and at least one floating electrode 7 wherein the floating electrode 7 comprises a first area 10 adjacent the at least one charged substrate 3, a second area 11 adjacent the channel of two dimensional material 5 and a conductive interconnection 9 between the first area 10 and the second area 11 wherein the first area 10 is larger than the second area 11 and wherein the at least one floating electrode 7 is arranged to control the level of doping within the channel of two dimensional material 5.

The apparatus 1 may be for controlling a doping pattern within a two dimensional material.

Figure 1:
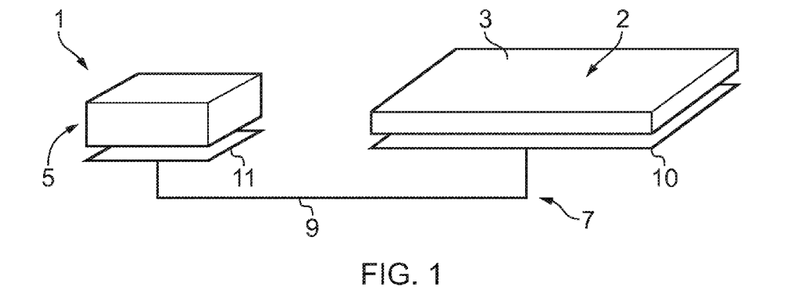
FIG. 1 illustrates an apparatus.

FIG. 1 schematically illustrates an apparatus 1 according to examples of the disclosure. The apparatus 1 comprises at least one charged substrate 3, a channel of two dimensional material 5, and at least one floating electrode 7. Only one floating electrode 7 is illustrated in FIG. 1. It is to be appreciated that a plurality of floating electrodes 7 may be provided in other examples of the disclosure.

The at least one charged substrate 3 may comprise any material which may be configured to have a non-zero polarization. The charged substrate may comprise bound charges. For instance the charged substrate 3 could comprise at least one of; a ferroelectric material, a piezoelectric material, a pyroelectric material or any other suitable material which may be engineered to have a non-zero polarization.

In some examples the charge distribution across the at least one charged substrate 3 may be uniform across the surface of the substrate.

In some examples a control signal 2 may be provided to control the charge of the charged substrate 3. In some examples the charge on the substrate 3 may be dependent upon a parameters such as the temperature or deformation of the at least one charged substrate 3 or any other parameter.

The channel of two dimensional material 5 may comprise any two dimensional material which has a resistance which may be tuned by the field effect. For example the channel of two dimensional material 5 may comprise a monolayer of graphene or any other suitable material.

In some examples the two dimensional material 5 may be provided on a charged substrate. In such examples the channel of two dimensional material 5 may comprise a material which may be grown on or deposited on the charged substrate 3.

The floating electrode 7 may comprise any conductive material such as metal, semiconductor, two dimensional material, ionic-liquid, ionic gel or any other suitable material. In some examples the floating electrode 7 may comprise graphene or indium tin oxide or any other suitable material.

In some examples the floating electrode 7 may be deformable and/or transparent.

The floating electrode 7 comprises a first area 10, a second area 11 and a conductive interconnection 9. The first area 10 is provided adjacent to the at least one charged substrate 3. The second area 11 is provided adjacent to the channel of two dimensional material 5. The conductive interconnection 9 is provided between the first area 10 and the second area 11. The floating electrode 7 may be formed as separated interconnected components or as a single integral component, for example, as a patterned layer of the same material.

The first area 10 may be larger than the second area 11. The size difference of the first area 10 compared to the second area 11 may enable the floating electrode 7 to amplify an electrostatic voltage at the first area 10 to a larger electrostatic voltage at the second area 11. The electrostatic voltage at the first area 10 is a result of charge on the charged substrate 3. The electrostatic voltage at the second area 11 is dependent upon the electrostatic voltage at the first area 10 amplified by a ratio of the first area 10 to the second area 11.

In some examples the floating electrode 7 may be electrically isolated or electrically isolatable. That is, the floating electrode 7 may be an electrode that may be permanently electrically isolated or switched to become electrically isolated. The isolation ensures that the floating electrode 7 is a closed electrical circuit that conserves charge. There is no direct current path between the floating electrode 7 and the channel of two dimensional material 5.

Figure 2:
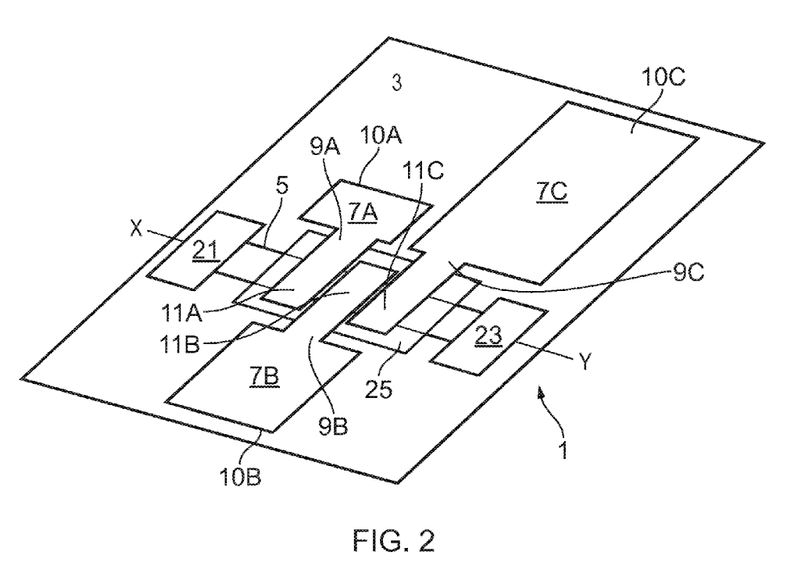
FIG. 2 illustrates a perspective view of an apparatus.

FIG. 2 illustrates a perspective view of an apparatus 1 according to examples of the disclosure. The apparatus 1 comprises at least one charged substrate 3, a channel of two dimensional material 5, and a plurality of floating electrodes 7 which may be as described above. Corresponding reference numerals are used for corresponding features.

In the example apparatus 1 of FIG. 2 a single charged substrate 3 is provided. Each of the floating electrodes 7 has an area which is provided adjacent to the charged substrate 3. The charged substrate 3 may underlie all of the floating electrodes 7 and the channel of two dimensional material 5.

In the example of FIG. 2 three floating electrodes 7A, 7B and 7C are provided. It is to be appreciated that any number of floating electrodes 7 may be provided in other examples of the disclosure. Each of the floating electrodes 7A, 7B and 7C comprises a first area 10A, 10B, 10C, a second area 11A, 11B, 11C and a conductive interconnection 9A, 9B, 9C.

Where a plurality of floating electrodes 7 are provided, different floating electrodes 7 may have different sized first areas 10 and/or different sized second areas 11. In the example of FIG. 2 each of the floating electrodes 7A, 7B, 7C have different sized first areas 10A, 10B, 10C but the same sized second areas 11A, 11B, 11C. It is to be appreciated that other arrangements could be used in other examples.

The channel of two dimensional material 5 is formed on top of the charged substrate 3. The channel of two dimensional material 5 is provided between a source 21 and a drain 23. In some examples the channel of two dimensional material 5 and the source 21 and the drain 23 may be provided by a layer of graphene or any other suitable material. Conductive terminals may be applied to the source 21 and, separately, to the drain 23.

An insulating material 25 is provided over the channel of two dimensional material 5. The insulating material 25 may be provided between the channel of two dimensional material 5 and the second area 11 of the floating electrode 7. The insulating material 25 may prevent electrical connection between the floating electrode 7 and the channel of two dimensional material 5. The insulation material 25 may comprise a dielectric material or any other suitable material.

The floating electrodes 7 may be configured to control the doping within the channel of two dimensional material 5. Each of the floating electrodes 7A, 7B, 7C comprises a first area 10A, 10B, 10C provided adjacent to the charged substrate 3. In the example of FIG. 2 each of the different floating electrodes 7A, 7B, 7C has a different sized first area 10A, 10B, 10C. The electrostatic voltage at each of the first areas 10 is a dependent upon the size of the overlap between the first area 10 and the charged substrate 3. Therefore in the example of FIG. 2 each of the floating electrodes 7A, 7B, 7C will have different electrostatic voltages at the respective first areas 10A, 10B, 10C.

Each of the floating electrodes 7A, 7B, 7C also comprises a second area 11A, 11B, 11C provided adjacent to the channel of two dimensional material 5. Each of the second areas 11A, 11B, 11C is connected to the first areas 10A, 10B, 10C by a corresponding conductive interconnect 9A, 9B, 9C.

In the example of FIG. 2 each of the second areas 11A, 11B, 11C is the same size so that each of the floating electrodes 7A, 7B, 7C has the same overlap with the channel of two dimensional material 5. As each of the floating electrodes 7A, 7B, 7C have different electrostatic voltages at the respective first areas 10A, 10B, 10C this means that, in the example of FIG. 2 each of the floating electrodes 7A, 7B, 7C will also have different electrostatic voltages at the respective second areas 11A, 11B, 11C. This creates different electric fields at different points along the channel of two dimensional material 5 which provides different levels of doping at different positions within the channel of two dimensional material 5.

Figure 3:
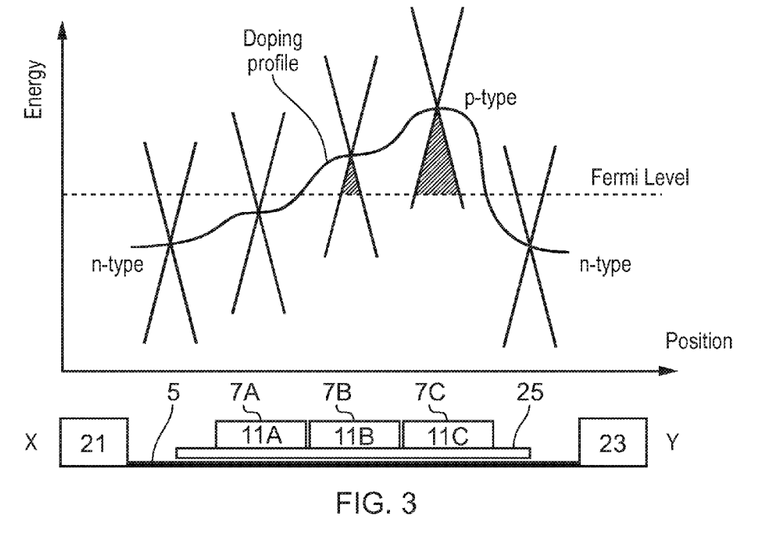
FIG. 3 illustrates a cross section through the apparatus of FIG. 2 and a corresponding doping profile.

FIG. 3 illustrates a cross section through the apparatus 1 of FIG. 2 and a doping profile along the channel of two dimensional material 5.

FIG. 3 is a cross section through the line X-Y. Corresponding reference numerals are used for corresponding features. In this example the two dimensional material is intrinsically n-type. The charged substrate 3 produces a negative charge density on the surface of the substrate 3. The electric field at the second areas 11A, 11B, 11C of the floating electrodes 7A, 7B, 7C causes the two dimensional material to become more p-type.

In the example apparatus of FIGS. 2 and 3 the first areas 10A, 10B, 10C of the electrodes increase in size along the length of the channel of two dimensional material 5. This increases the size of the electric field along the length of the channel of two dimensional material 5 and causes the doping to become increasingly p-type.

Figure 4:
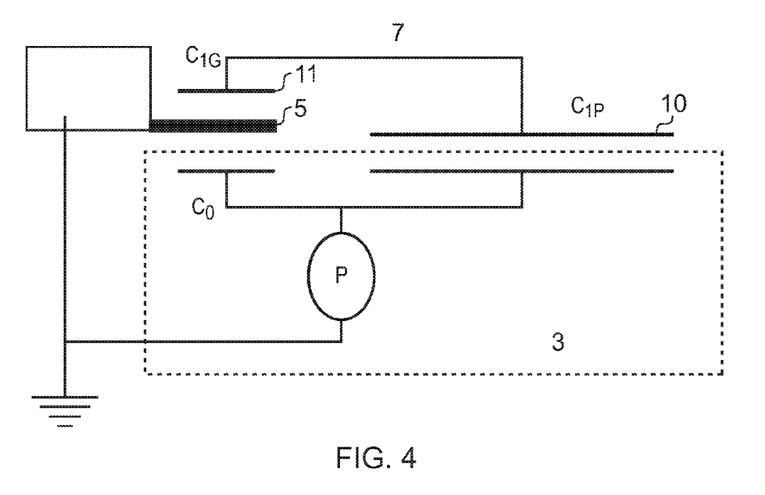
FIG. 4 illustrates an equivalent circuit diagram for an apparatus.

FIG. 4 illustrates an equivalent circuit diagram for the floating electrodes 7 and the charged substrate 3 of the apparatus 1 of FIGS. 1 to 3.

Each floating electrode 7 enables a combination of two capacitors in series to be formed. The charged substrate 3 and the first area 10 of the floating electrode 7 form a first capacitor $C_{1P}$. The first capacitor $C_{1P}$ has an effective area $A_{1P}$ corresponding to the first area 10 of the floating electrode 7. The first capacitor $C_{1P}$ stores a charge $Q_{1P}$ over the area $A_1$ and develops a voltage $V_{1G}$.

The channel of two dimensional material 5 and the second area 11 of the floating electrode 7 form a second capacitor $C_{1G}$. The second capacitor $C_{1G}$ has an effective area $A_{1G}$ corresponding to the second area 11 of the floating electrode 7. The second capacitor $C_{1G}$ stores a charge $Q_{1G}$ over the area $A_{1G}$ and develops a voltage $V_{1G}$.

As the bias of the channel of two dimensional material 5 is usually quite low (that is less than 1 V) the two dimensional material 5 of the second capacitor $C_{1G}$ can be treated as ground.

As the capacitors $C_{1P}$ and $C_{1G}$ are in series, for a given polarization P of the charged substrate 3, the charge on both capacitors $C_{1P}$, $C_{1G}$ must be the same. That is:

$$Q_{1P}=Q_{1G}$$

Therefore the top gate potential applied to channel of two dimensional material 5 under the second area 11 of the floating electrode 7 is:

$$V_{1G} = \frac{Q_{1G}}{C_{1G}} = \frac{Q_{1P}}{C_{1G}}$$

As $C_{1G}$ is constant, the voltage $V_{1G}$ is proportional to the charge $Q_{1P}$ and thus proportional to the polarization P of the charged substrate 3 and the first area 10.

$$Q_{1P}=P*A_{1P}$$

The doping profile may be modulated by using different floating electrodes 7 to apply different top-gate voltages to different regions of the channel of two dimensional material 5. The different top-gate voltages may be provided at zero energy cost by the charged substrate 3.

The different top-gate voltages may be controlled by the respective areas 10, 11 of the floating electrode 7.

As the second voltage $V_{1G}$ scales with the capacitance ratio $C_{1P}/C_{1G}$ different second voltages $V_{1G}$ may be provided by having different floating electrodes 7 with different capacitance ratios $C_{1P}/C_{1G}$. In some examples it may be desirable for $C_{1P}$ to be larger than $C_{1G}$. This may be achieved by making the first area 10 larger than the second area 11.

Therefore the charged substrate 3 and the first area 10 of the floating electrode 7 form a first capacitor $C_{1P}$ having a first electric field dependent upon a polarization of the charged substrate 3. The first electric field causes, at the second area 11 of the floating electrode, a second electric field that is dependent upon the first electric field amplified by a ratio of the first area 10 to the second area 11.

It is to be appreciated that a third capacitor $C_0$ may be formed directly by the channel of two dimensional material 5 and the charged substrate 3. This may affect the doping level within the channel of two dimensional material 5. However this doping effect is an offset that applies to the whole channel of two dimensional material 5 and does not contribute to any modulation doping. The direct effect of the charged substrate 3 on channel of two dimensional material 5 is significantly lower than the effect of the effect of the charged substrate 3 on the first area 10 of the floating electrode 7. This allows the capacitor $C_0$ to be disregarded in the above explanation.

In some examples an insulating material may be provided between the charged substrate 3 and the channel of two dimensional material 5. This may remove the capacitor $C_O$ by detaching the channel of two dimensional material 5 from the charged substrate 3.

In the example of FIGS. 2 and 3 the floating electrodes 7 have different sized first areas 10 but same sized second areas 11. It is to be appreciated that different sized and shaped floating electrodes 7 may be used to obtain different doping profiles. There are virtually no boundaries to the complexity and shape that can be obtained for the doping profile of the two dimensional material. The only limitation on the doping profile is the area available on the charged substrate 3.

In some examples of the disclosure all of the floating electrodes 7 may be manufactured in a single step. This may be achieved regardless of how many floating electrodes 7 are needed, the sizes of the floating electrodes 7 and the variation in shapes of the different floating electrodes 7.

Figure 5:
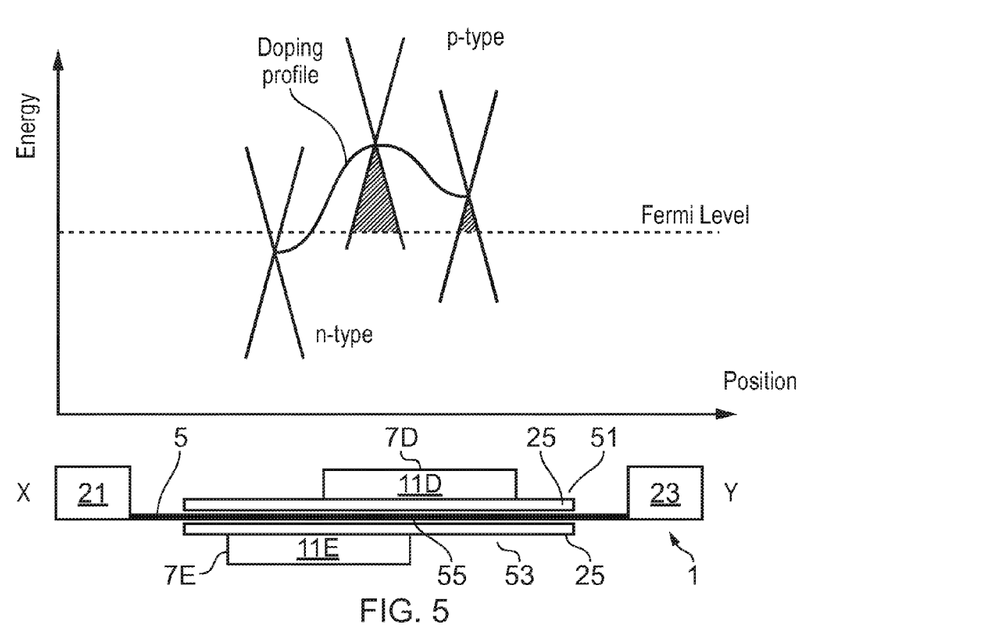
FIG. 5 illustrates a cross section through another apparatus and a corresponding doping profile.

FIG. 5 illustrates a cross section through another apparatus 1 and a corresponding doping profile. The apparatus 1 comprises a charged substrate 3 and a channel of two dimensional material 5 which extends between a source 21 and a drain 23 which may be as described above. The apparatus 1 also comprises a first floating electrode 7D and a second floating electrode 7E.

The floating electrodes 7D and 7E of the apparatus of FIG. 5 may be as described above and may each comprise a first area 10D, 10E adjacent to the charged substrate 3 and a second area 11D, 11E adjacent to the channel of two dimensional material 9 and a conductive interconnect 9D, 9E as described above. As FIG. 5 is a cross section only portions of the respective second areas 11D, 11E are illustrated in FIG. 5.

In the example of FIG. 5 the first floating electrode 7D is provided on a first side 51 of the charged substrate 3 and the second floating electrode 7E is provided on a second side 53 of the charged substrate 3. A layer of insulating material 25 is also provided between the channel of two dimensional material 5 and each of the floating electrodes 7D, 7E.

In the example of FIG. 5 the second area 11D of the first floating electrode 7D is the same as the second area 11E of the second floating electrode 7E. The first floating electrode 7D has a larger first area 10D than the second floating electrode 7E. Although the respective first areas 10D, 10E are not shown in FIG. 5 they can be deduced from the respective doping levels.

In the example of FIG. 5 the second area 11D of the first electrode 7D overlaps with the second area 11E of the second electrode 7E. This provides a double gated region 55 within the channel of two dimensional material 5. This provides the strongest electric field and therefore the highest doping level within the double gated region 55.

In the example of FIG. 5 one floating electrode 7 is provided on either side 51, 53 of the substrate. It is to be appreciated that any number of floating electrodes 7 may be provided on either side 51, 53 of the charged substrate 3.

Providing floating electrodes 7 on either side of the substrate may provide several advantages. It may reduce the number of floating electrodes 7 which are needed as different doping levels may be achieved by overlapping respective floating electrodes 7. It may also remove the third capacitor $C_O$ which may make the apparatus 1 simpler.

FIGS. 6A to 6D illustrate example devices and results obtained with the example devices. The example apparatus 1 comprises a channel of two dimensional material 5, a charged substrate 3 and at least one floating electrode 7 as described above.

Figure 6A:
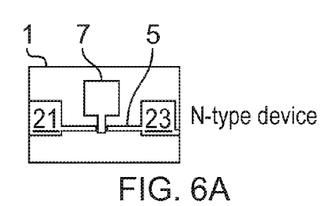
FIGS. 6A to 6D illustrate an example apparatus and results obtained with example apparatus.
Figure 6B:
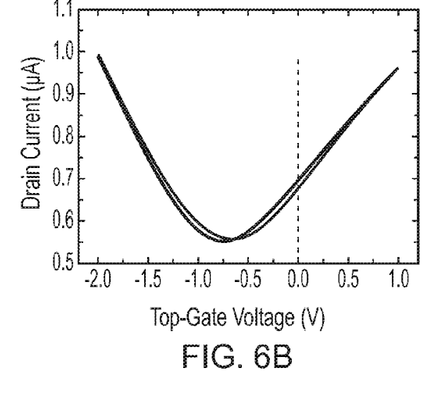
Figure 6C:
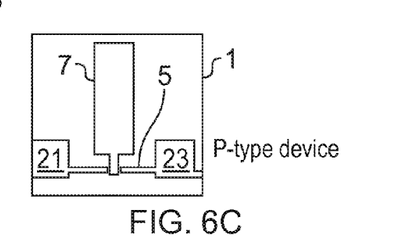

FIG. 6A shows a first example apparatus 1 and FIG. 6C shows a second example apparatus 1. In both of the example apparatus the channel of two dimensional material 5 comprises graphene. In both of the examples a pyroelectric material, z-cut $LiNbO_3$, was used as the charged substrate 3.

The two example apparatus 1 have different sized floating electrodes 7. In the example apparatus 1 of FIG. 6A the first area 10 of the floating electrode $A=10^{-4}$ cm$^2$. In the example apparatus 1 of FIG. 6C the first area 10 of the floating electrode $3A=3*10^{-4}$ cm$^2$.

Figure 6D:
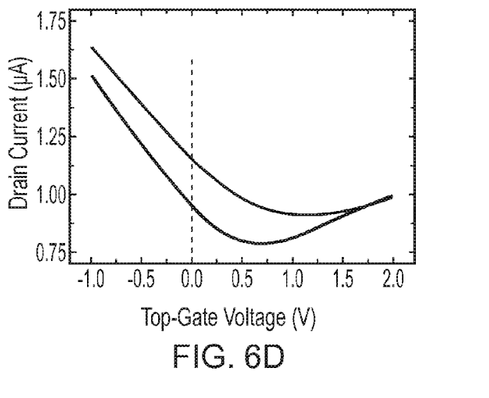

FIGS. 6B and 6D are plots of the electrical measurements obtained with the respective apparatus 1. The electrical measurements were taken at a constant temperature of 293K. It can be seen that the different floating electrodes translated the constant polarization of the charged substrate 3 into different negative top-gate voltages. FIG. 6B shows that this resulted in the apparatus of FIG. 6A retaining some of the original n-type nature of the graphene. FIG. 6D shows that this also resulted in the apparatus of FIG. 6C undergoing a larger doping shift leading to p-type behaviour. Therefore this shows that different floating electrodes 7 can produce different levels of doping.

Figure 7A:
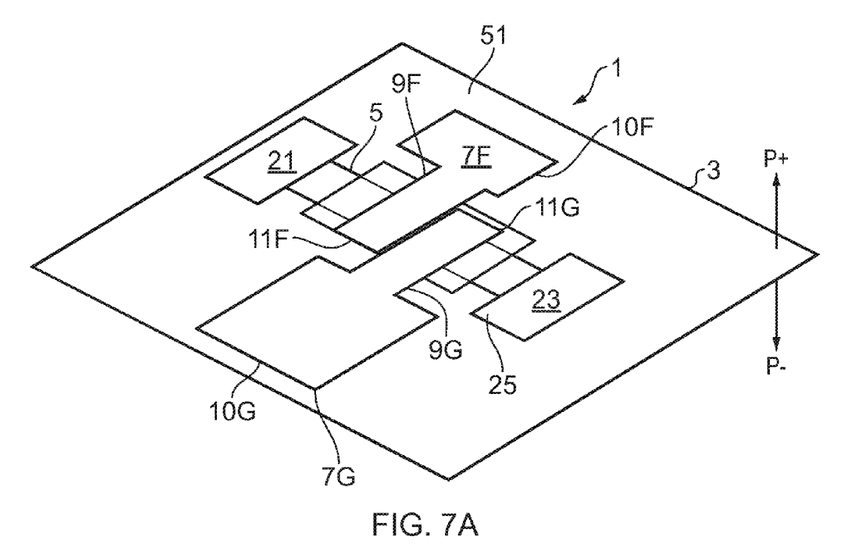
FIGS. 7A to 7C illustrate an example apparatus and results obtained with example apparatus.
Figure 7B:
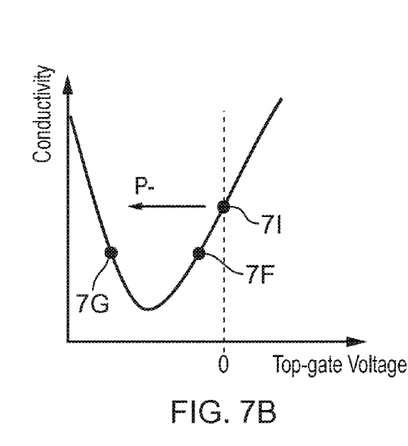
Figure 7C:
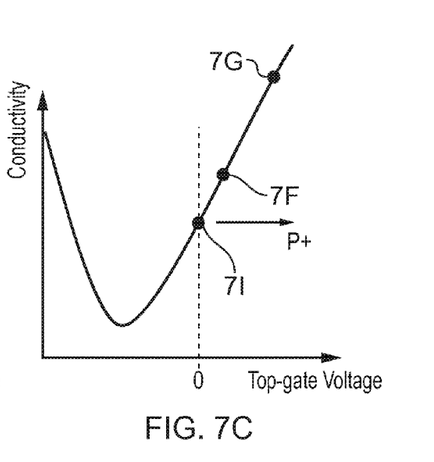

FIGS. 7A to 7C illustrate another example apparatus 1 and results obtained with this example apparatus 1. The example apparatus of FIG. 7A comprises a charged substrate 3, a channel of two dimensional material 5 and two floating electrodes 7F and 7G which may be as described above. In the example of FIG. 7A the first floating electrode 7F has a smaller first area 10F than the second floating electrode 7G. The two floating electrode 7F, 7G have the same sized second areas 11F, 11G.

The example apparatus 1 may also comprise an external drive which may enable the charge on the substrate 3 to be controlled. For instance the charged substrate 3 may comprise a material such as a ferroelectric, piezoelectric or pyroelectric material which has a polarization that can be varied by means of electric fields, mechanical stress and temperature, respectively.

In the example of FIG. 7A the apparatus 1 comprises a ferroelectric material in which the polarization is controlled by an electric device. In the example of FIG. 7A the overall polarization of the charged substrate 3 can be switched between positive polarization P+ and negative polarization P−. The switch in polarization may be achieved by applying a voltage to a bottom gate connected to the charged substrate 3. It is to be appreciated that other materials and means for controlling polarization may be used in other examples of the disclosure.

FIG. 7B shows results obtained when the charged substrate has a negative polarization P− so that a negative surface charge is developed on the first surface 51 of the charged substrate 3.

In FIG. 7B the dot 71 represents the un-gated two dimensional material and so shows the intrinsic doping of the two dimensional material. In this example the intrinsic doping is n-type. The dot 7F represents the region gated by the first floating electrode 7F which remains n-type. The dot 7G represents the region gated by the second floating electrode 7G. The doping in this region is more negatively shifted and becomes p-type.

FIG. 7C shows results obtained when the charged substrate has a positive polarization P+ so that a positive surface charge is developed on the first surface 51 of the charged substrate 3.

In FIG. 7C the dot 71 represents the un-gated two dimensional material and so shows the intrinsic doping of the two dimensional material. As in the previous example the intrinsic doping is n-type. The dot 7F represents the region gated by the first floating electrode 7F and the dot 7G represents the region gated by the second floating electrode 7G. In this example a highly n-doped region is provided.

Therefore the example apparatus 1 of FIG. 7A can be switched between different doping patterns by switching the polarization of the charged substrate 3. This may be useful in forming devices which require a p-n junction such as photodetector or other type sensor. The p-n junction may be switched on and off by changing the polarization of the charged substrate 3.

In the example of FIGS. 7A to 7C the polarization of the charged substrate 3 is switched between positive polarization P+ and negative polarization P−. It is to be appreciated that in some examples the doping profile may be controlled by continuously tuning the charge on the charged substrate 3. For instance the temperature of a pyroelectric substrate may be tuned to tune the polarization of the pyroelectric material.

Figure 8:
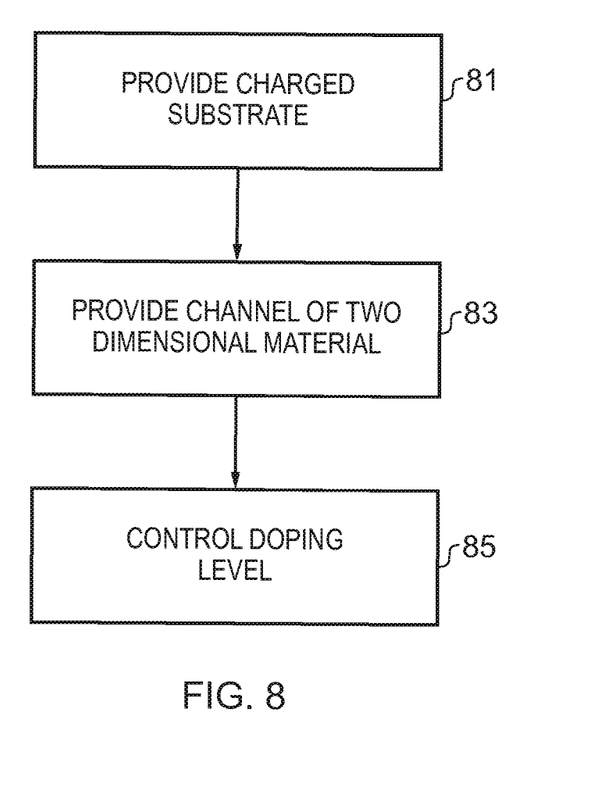
FIG. 8 illustrates a method according to examples of the disclosure.

FIG. 8 illustrates a method of providing an apparatus 1 according to examples of the disclosure. The method may be used to provide an apparatus 1 as described above. The method comprises providing, at block 81, at least one charged substrate 3. The method also comprises providing, at block 83, a channel of two dimensional material 5 and at block 85 the method comprises controlling the level of doping within the channel of two dimensional material 5. Controlling the level of doping may comprise providing at least one floating electrode 7 wherein each floating electrode 7 comprises a first area 10 adjacent the at least one charged substrate 3, a second area 11 adjacent the channel of two dimensional material 5 and a conductive interconnection 9 between the first area 10 and the second area 11 wherein the first area 10 is larger than the second area 11.

Examples of the disclosure provide for an apparatus and method which allow for the doping profile of a two dimensional material to be controlled. The apparatus 1 allows for design freedom in the doping profile as the shape of the patterns and the level of doping can be controlled through the sizes of the respective areas 10, 11 of a floating electrode.

The floating electrodes 7 may be fabricated in a single step. This may enable apparatus 1 with complex doping patterns within a two dimensional material to be easily fabricated.

The apparatus 1 also allows for the doping profile to be changed by changing the charge on the charged substrate 3. This may enable certain devices to be switched between different operating states.

In the above examples the term coupled means operationally coupled. It is to be appreciated that any number or combination of intervening elements can exist including no intervening elements.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class. It is therefore implicitly disclosed that a features described with reference to one example but not with reference to another example, can where possible be used in that other example but does not necessarily have to be used in that other example.

Although examples of the disclosure have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   at least one charged substrate;
   a channel of two dimensional material provided between a source electrode and a drain electrode; and
   a plurality of electrically isolated floating electrodes provided adjacent to different portions of the channel of two dimensional material so that they overlap with the channel of two-dimensional material,
   wherein each electrically isolated floating electrode in the plurality of electrically isolated floating electrodes comprises a first area adjacent to the at least one charged substrate, a second area adjacent to the channel of two dimensional material, and a conductive interconnection between the first area and the second area, wherein the first area is larger than the second area.

2. The apparatus as claimed in claim 1, wherein the doping within the two dimensional material is dependent upon an electric field provided by the second area of the plurality of electrically isolated floating electrodes.

3. The apparatus as claimed in claim 1, wherein, for the plurality of electrically isolated floating electrodes, a charged substrate and the first area of each of the plurality of electrically isolated floating electrodes form a first capacitor having a first electric field dependent upon the charge on the substrate and wherein the first electric field causes, at the second area of each of the plurality of electrically isolated floating electrodes, a second electric field that is dependent upon the first electric field amplified by a ratio of the first area to the second area.

4. The apparatus as claimed in claim 1, wherein an insulating material is provided between the channel of two dimensional material and the second area of the plurality of electrically isolated floating electrodes.

5. The apparatus as claimed in claim 1, wherein the channel of two dimensional material is provided on a charged substrate wherein the first area of the plurality of electrically isolated floating electrodes overlays a first area of the charged substrate wherein the channel of the two dimensional material does not extend over the first area.

6. The apparatus as claimed in claim 5, wherein an insulating material is provided between the charged substrate and the channel of two dimensional material.

7. The apparatus as claimed in claim 1, wherein the channel of two dimensional material comprises graphene.

8. The apparatus as claimed in claim 1, wherein the at least one charged substrate comprises at least one of a ferroelectric material, a piezoelectric material, a pyroelectric material, or any other suitable material.

9. The apparatus as claimed in claim 1, further comprising a controller configured to control the charge on the plurality of electrically isolated floating electrodes.

10. A method comprising:
providing at least one charged substrate;
providing a channel of two dimensional material between a source electrode and a drain electrode; and
controlling the level of doping within the channel of two dimensional material by providing a plurality of electrically isolated floating electrodes adjacent to different portions of the channel of two dimensional material so that they overlap with the channel of two-dimensional material, wherein each electrically isolated floating electrode in the plurality of electrically isolated floating electrodes comprises a first area adjacent to the at least one charged substrate, a second area adjacent to the channel of two dimensional material, and a conductive interconnection between the first area and the second area wherein the first area is larger than the second area.

* * * * *